United States Patent [19]

Lacombat et al.

[11] 4,140,392
[45] Feb. 20, 1979

[54] OPTICAL SYSTEM FOR PROJECTING PATTERNS COMPRISING A CONSTANT-MAGNIFICATION FOCUSING SERVOCONTROL

[75] Inventors: Michel Lacombat; René Gerard, both of Paris, France

[73] Assignee: Thomson-CSF, Paris, France

[21] Appl. No.: 897,168

[22] Filed: Apr. 17, 1978

[30] Foreign Application Priority Data

Apr. 20, 1977 [FR] France ................................ 77 11910

[51] Int. Cl.² ........................ G03B 27/34; G03B 27/42
[52] U.S. Cl. ........................................... 355/56; 355/53
[58] Field of Search ....................... 355/53, 55, 56, 58

[56] References Cited

U.S. PATENT DOCUMENTS

| | | | |
|---|---|---|---|
| 3,625,607 | 12/1971 | Bravenec | 355/56 |
| 3,632,205 | 1/1972 | Marcy | 355/53 |
| 3,704,657 | 12/1972 | Sliwkowski et al. | 355/53 X |
| 3,728,019 | 4/1973 | Swing | 355/56 X |

Primary Examiner—Donald A. Griffin
Attorney, Agent, or Firm—Cushman, Darby & Cushman

[57] ABSTRACT

The system according to the invention comprises means for displacing the lens and the object enabling magnification and focusing to be adjusted in dependence upon the lens used and co-operating with servocontrol means for the position of the lens which provide for automatic focusing while keeping magnification constant.

6 Claims, 3 Drawing Figures

OPTICAL SYSTEM FOR PROJECTING PATTERNS COMPRISING A CONSTANT-MAGNIFICATION FOCUSING SERVOCONTROL

This invention relates to optical projection systems and more particularly to photorepetition systems intended for transferring patterns onto a photosensitive plate in order to produce electronic circuits and components by the technique of masking.

A photorepeater comprises a light source illuminating a modulating object of which the non-uniform transparency characterises the pattern to be transferred, a lens projecting the image of the pattern onto a photosensitive plate with a magnification generally equal to (1/10). The pattern is repeated in an arrangement of lines and columns, the photosensitive plate being supported by a stage integral with a table comprising displacement means by which it is possible as required to bring certains regions of the plate opposite the lens.

According to the invention, the object on one hand and the lens on the other hand may be displaced in a direction parallel to the optical axis of the system, thus enabling magnification and focusing to be adjusted at the same time without disturbing the alignment of the elements relative to the optical axis. The optical system comprises a servocontrol mechanism for focusing without any change in magnification. It enables various types of lenses to be used.

The invention may be used in the production of masks subsequently intended for the transfer in true size of a collection of patterns of reduced dimensions or for the direct recording of the patterns on a reduced scale on the substrate itself by the technique of direct photorepetition.

In accordance with the present invention, there is provided an optical system for projecting patterns, said system enabling the image of an object having a non-uniform transparency to be reproduced on a photosensitive surface with a predetermined magnification, said system comprising, along a same optical axis, a source providing a light beam onto said surface, a lens, a lens holder supporting said lens, a first carriage integral with said lens holder, an object inserted between said source and said lens, an object holder supporting said object, a second carriage integral with said object holder and a support having a photosensitive surface; the image of said object being projected onto said support by said lens; said system further comprising electromechanical transducer means for moving said lens holder in a direction parallel to said optical axis for the purposes of automatic focusing, first adjusting means for moving said lens holder in said direction enabling the operating range of said transducer means to be centered and second adjusting means for adjusting the distance between said first and second carriages; said transducer means and said first adjusting means causing displacements of said first and second carriages simultaneous and of equal amplitude, in order to keep constant said magnification.

For a better understanding of the present invention, and to show how the same may be carried into effect, reference will be made to the ensuing description and the following figures among which:

Figure 1:
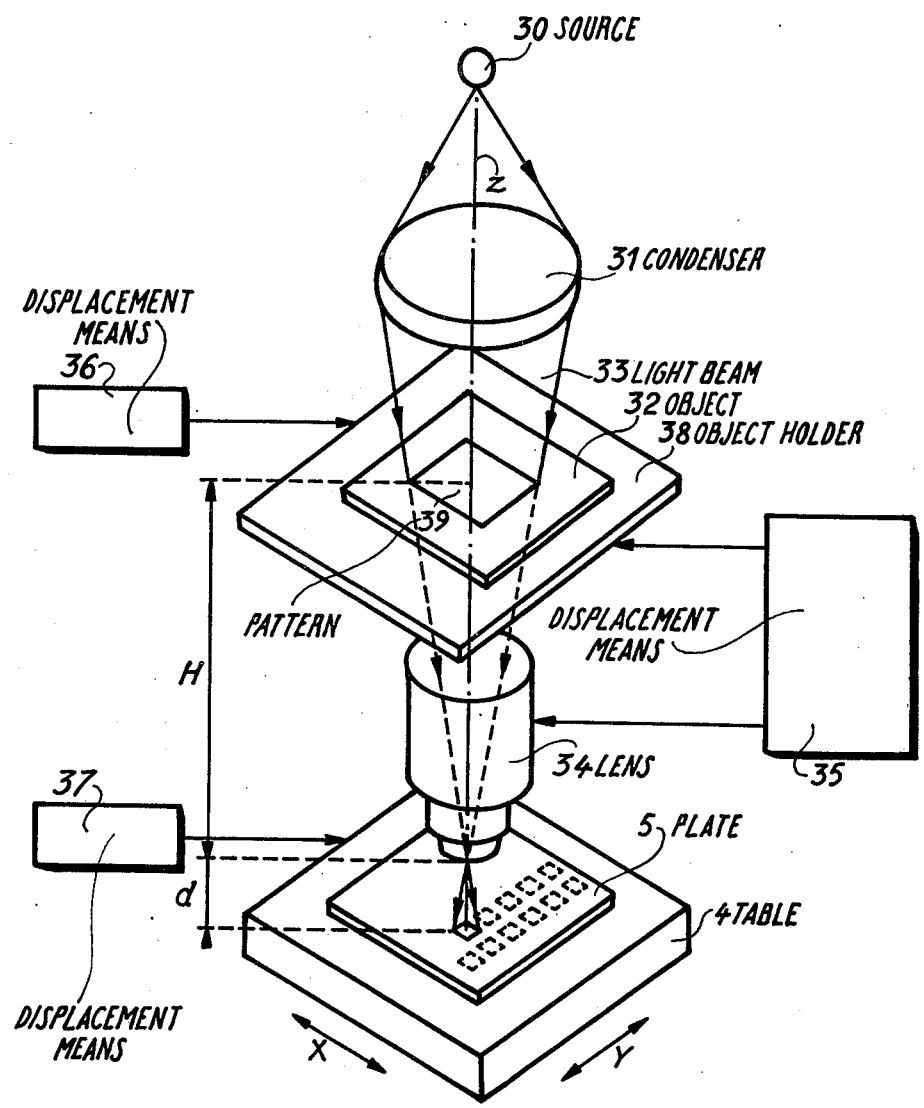
FIG. 1 shows the general layout of an optical system for projecting patterns.

FIG. 1 shows the general layout of a single-lens projection system. It comprises a light source 30 of the mercury vapour lamp type or any other source of substantially monochromatic light of wavelength $\lambda$ which, during a predetermined time, supplies a light beam 33 of axis z illuminating an object 32 by way of a condenser 31. The object is situated in a plane perpendicular to the optical axis z. It is carried by an object holder 38. The pattern 39 recorded on the object 32 is projected onto a plate 5, of which the surface is photosensitive for the wavelength $\lambda$, by means of a lens 34 with a magnification of less than 1. In the particular case of photorepetition, projection is repeated a large number of times on various zones of the plate 5, for example in an arrangement of lines and colums. The plate 5 is put on a table 4 which can be displaced along two axes X and Y by means of a displacement unit 37 containing stepping motors. The plate 5 may be a mask consisting of a transparent plate coated with a photographic emulsion or of a layer of photoresist covering a fine opaque deposit intended to be etched. It may be a substrate of semiconductor material coated with a photosensitive resin. Other displacement means 36 may be provided for positioning the object relative to the reference axes X and Y.

The magnification G introduced by the lens 34 is equal to (d/H), d being the distance between the lens 34 and the surface of the plate 5 and H being the distance between the lens 34 and the surface of the object 32. f being the focal length of the lens, the optical conjugation of the object 32 and the plat 5 is governed by the equation $(1/d) + (1/H) = 1/f$. During the positioning of the various elements, it is necessary to adjust the distances H and d so as to ensure focusing and the desired magnification. Moreover these adjustements have to be maintained during a transfer operation, taking into account any imperfections in the flatness of the plate 5 and in the movement of the table 4. Finally, the adjustments must not affect the alignment of the various elements relative to the reference axes X and Y. To this end, the invention provides displacement means 35 which act on the object and on the lens to enable the distances d and H to be adjusted without modifying the parallelism and alignment of the various elements along the optical axis z.

Figure 2:
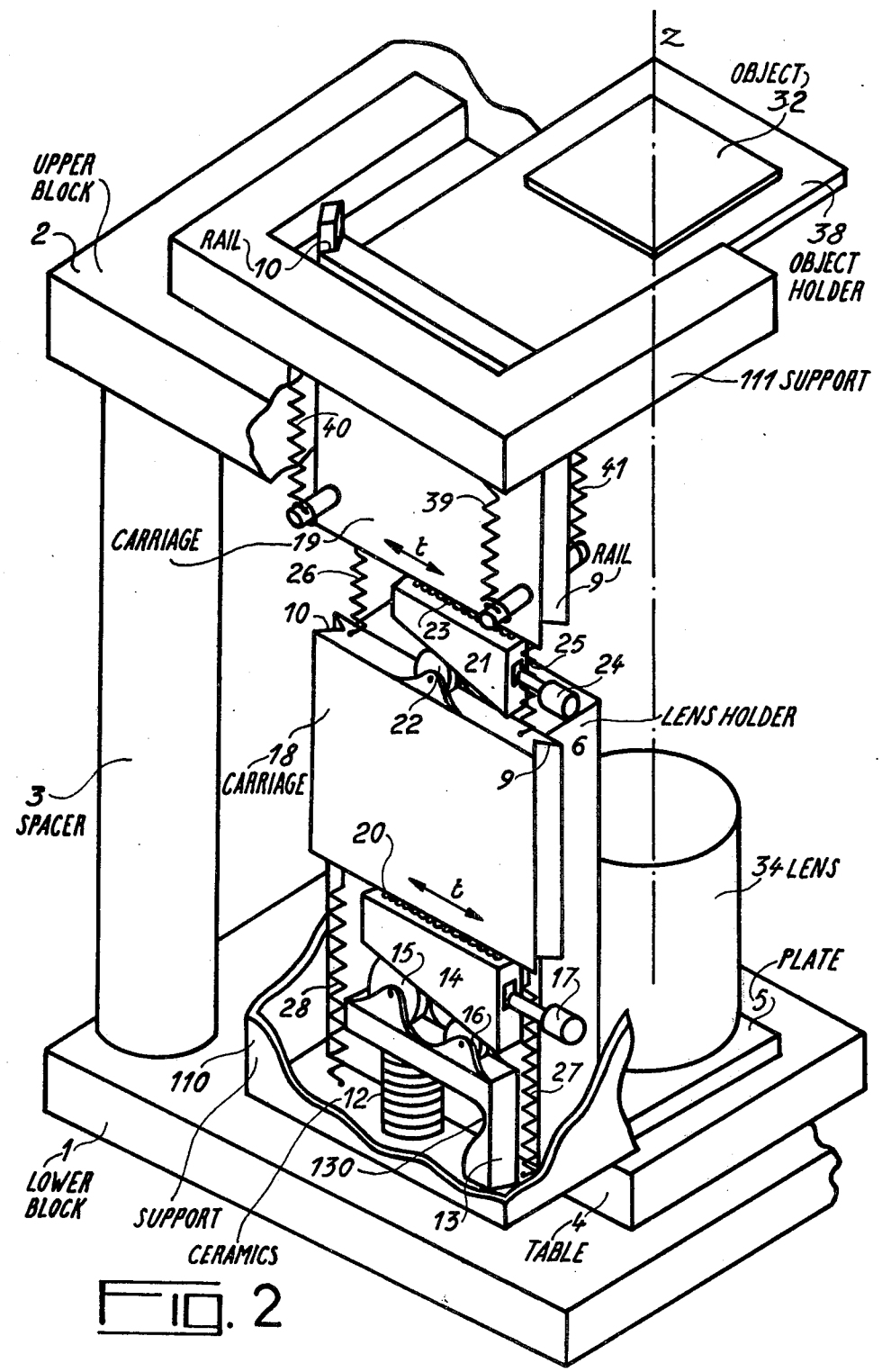
FIG. 2 shows a photorepeater according to the invention.

FIG. 2 is a view of one embodiment of the photorepeater according to the invention and in particular of the displacement means 35. The various elements of the photorepeater rest on two granite blocks; a lower block 1 and an upper centrally recessed block 2 separated by adjustable spacer members of which only one (3) is shown in the Figure. The two blocks define two parallel planes. The adjustment of the parallelism may be controlled by self-collimating lens to ± 5 seconds. On the lower block rests the table 4 carrying the plate 5 of which the movements in the directions X and Y take place in the reference plane defined by the block. Between the two planes there is a support 11 of which only the lower part 110, integral with the block 1, and the upper part 111, integral with the block 2, can be seen in the FIG. 2. The lower side walls of the support carry guide rails 9 and 10 parallel to the optical axis z on which the object and the lens are able to slide. The various elements are vertically adjacent in a direction parallel to z in the following manner: to the lower part of the support 110 are fixed electromechanical transducers, for example in the form of a stack of piezoelectric ceramics 12, co-operating with sensors associated with the lens in order to establish a focusing servocontrol. On the ceramics 12 is arranged a beam-like member 13 comprising a portion 130 of reduced thickness of which the lower part is fixed to the support 110. The assembly is described in French Pat. application No. 76.34 914. Above this assembly, there is a wedgelike member 14 of which the lower surface forms an inclined plane relative to the axis z. This member is bound to the member 13 by way of two fixed-axis rollers 15 and 16 mounted for free rotation so as to allow a displacement in a direction t perpendicular to z under the action of a micrometer screw 17 which extends through the support 11 and is therefore accessible to the user. The member 14 acts as a support to a carriage 18 integral with a lens holder 6 which itself supports the lens 34. The carriage 18 is able to slide along the support 11 by means of the guide rails 9 and 10 in a direction parallel to z. A roller system 20, which may be formed by balls or rollers, enables the member 14 to be displaced relative to the carriage 18 in the direction t. The displacement assembly formed by the member 14, the carriage 18, the rollers 15 and 16 and the rolling system 20 enables a movement of the member 14 in the direction t controlled by the screw 17 to be converted into a movement of the carriage 18 in the direction z. It is thus possible to vary the distance d between the lens 34 and the plate 5 by means of the screw 17. It can also be seen that the contraction or expansion of the stack of ceramics 12 by the servocontrol mechanism enables the distance d to be kept constant by displacing the lens without any change in the distance H and hence in magnification. Above the carriage 10, there is a second displacement assembly very similar to the first one and formed by a single roller 22 of which the axle is fixed to the centre of the carriage 18, a wedge-shaped member 21 being able to be displaced in the direction t under the action of a micrometer screw 24 of which the end is accessible to the user outside the support 11, a rolling system 23 supporting a carriage 19 integral with the object holder 38. The carriage 19 is able to slide along the rails 9 and 10 and the movement of the member 21 in the direction t controlled by the screw 24 is converted into a movement of the carriage 19 in the direction z, thus enabling the distance H to be adjusted. Since the position of the two carriages 18 and 19 is guided by rails, it can be seen that it is important to have a single roller 22 to prevent hyperstatic operation of the assembly. By contrast, it is preferable to have two rollers 15 and 16 for the member 14 because the member 14 is situated between the carriage 18, guided by the rails 9 and 10, and the member 13 included in an elastic assembly. The position of this member 14 has to be referenced in relation to the carriage 18, which is obtained through two contact points by means of the two rollers 15 and 16 of which the diameters are different for the purposes of adaptation to the angle formed by the member 14. The superposition of the various elements in the direction z, preferably vertical, leads to a single line of force which co-operates with gravity to provide an equilibrium. In order to reduce the pressure force received by the ceramics 12 due to the heavy weight of the elements, in particular the lens holder, springs may be provided between the upper part of the support 111 and the lens holder 19. Three springs are visible in the FIG. 2: 39, 40, 41. Other springs are also provided, for example between the carriages 18 and 19 : 25 and 26 and between the carriage 18 and the lower part of the support 110 : 27 and 28, in order to eliminate any play so as to ensure the stability of the servocontrol loop.

The adjustments to magnification and focusing preceding any pattern transfer operation are carried out by acting simultaneously on the two screws 17 and 24. This is because the variation in d, like the variation in H, act both on magnification and on focusing. The adjustments are intended to adapt focusing to the lens used, because the characteristics can differ from one lens to another, and to obtain the required magnification. Typically, the magnification G is (1/10). For a lens having a focal length f of 50 mm, H + d = 600 mm, d = 54.6 mm. In one embodiment of the invention, the maximum excursion for d is 4 mm and for H 1 mm. The precision obtained for magnification is $10^{-5}$. During a transfer operation, the screws 17 and 24 are no longer acted upon. However, the distance d is kept constant by the focusing servocontrol by means of the ceramics 12. In the same embodiment, the ceramics have a dynamic factor of $\pm$ 40 $\mu$m for control voltages of $\pm$ 1000 V. In the event of a slight variation in the distance d attributable to an imperfection in the flatness of the plate 5 or in the movement of the table 4, the servocontrol system, by the expansion or contraction of the ceramics, returns d to its nominal value by causing a displacement not only of the lens but also of the object, thereby maintaining the distance H. The distance d may be servocontrolled to within 0.2 $\mu$m.

What we claim is:

1. An optical system for projecting patterns, said system enabling the image of an object having a non-uniform transparency to be reproduced on a photosensitive surface with a predetermined magnification, said system comprising along a same optical axis, a source providing a light beam onto said surface, a lens, a lens holder supporting said lens, a first carriage integral with said lens holder, an object inserted between said source and said lens, an object holder supporting said object, a second carriage integral with said object holder and a support having a photosensitive surface; the image of said object being projected onto said support by said lens; said system further comprising electromechanical transducer means for moving said lens holder in a direction parallel to said optical axis for the purposes of automatic focusing, first adjusting means for moving said lens holder in said direction enabling the operating range of said transducer means to be centered and second adjusting means for adjusting the distance between said first and second carriages; said transducer means and said first adjusting means causing displacements of said first and second carriages simultaneous and of equal amplitude, in order to keep constant said magnification.

2. A system as claimed in claim 1, wherein said second adjusting means comprise a first member inserted between said first and second carriages and having a first face opposite to said second carriage and a second face of which the plane form an edge with the plane of said first face, rolling elements associated to said first face enabling said first face to be displaced in its plane and a roller coming in contact with said second face and having an axle integral with said first carriage.

3. A system as claimed in claim 2, wherein said first adjusting means comprise a second member inserted between said first carriage and said transducer means and having a first face opposite to said first carriage and a second face of which the plane form an edge with the plane of said first face, rolling elements associated to said first face enabling said first face to be displaced in its plane and two rollers of different diameters coming in contact with said second face and of which the axles are integral with said transducer means.

4. A system as claimed in claim 3 further comprising springs tending to bring said first and second carriages together and to urge said first and second carriages towards said transucer means.

5. A system as claimed in claim 3 further comprising springs compensating the weight of said object holder on the other elements of said system.

6. A system as claimed in claim 1, wherein said transducer means comprise a stack of piezoelectric ceramics, a servocontrol device comprising a distance sensor detecting the distance between said lens and said surface, and amplifier means; said device providing an electrical signal controlling said stack; said transducer means further comprising an elastically articulated beam-like member having an arm supported by said stack.

* * * * *